(12) United States Patent
Kwak et al.

(10) Patent No.: US 7,644,496 B2
(45) Date of Patent: Jan. 12, 2010

(54) MANUFACTURING METHOD FOR IMPRINTING STAMPER

(75) Inventors: Jeong-Bok Kwak, Suwon-si (KR);
Seung-Hyun Ra, Seongnam-si (KR);
Choon-Keun Lee, Suwon-si (KR);
Jae-Choon Cho, Suwon-si (KR);
Sang-Moon Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 170 days.

(21) Appl. No.: 11/907,288

(22) Filed: Oct. 10, 2007

(65) Prior Publication Data

US 2008/0086877 A1   Apr. 17, 2008

(30) Foreign Application Priority Data

Oct. 12, 2006   (KR) .................... 10-2006-0099449

(51) Int. Cl.
*H05K 3/02* (2006.01)

(52) U.S. Cl. ................... 29/846; 29/825; 438/612; 438/613; 438/666; 438/669

(58) Field of Classification Search ............ 29/825, 29/846; 438/612, 613, 666, 669
See application file for complete search history.

(56) References Cited

U.S. PATENT DOCUMENTS

| | | | | |
|---|---|---|---|---|
| 5,575,878 A | * | 11/1996 | Cox et al. | 156/247 |
| 5,772,905 A | * | 6/1998 | Chou | 216/44 |
| 6,027,595 A | * | 2/2000 | Suleski | 156/230 |
| 6,277,666 B1 | * | 8/2001 | Hays et al. | 438/50 |
| 6,309,580 B1 | * | 10/2001 | Chou | 264/338 |
| 6,518,781 B2 | * | 2/2003 | Masuda | 324/757 |
| 6,875,695 B2 | * | 4/2005 | Harchanko et al. | 438/689 |
| 7,071,088 B2 | * | 7/2006 | Watts et al. | 438/612 |
| 2005/0147925 A1 | * | 7/2005 | Harchanko et al. | 430/320 |
| 2006/0065136 A1 | * | 3/2006 | Takahashi et al. | 101/3.1 |

* cited by examiner

*Primary Examiner*—C. J Arbes

(57) ABSTRACT

A manufacturing method for imprinting stamper is disclosed. The manufacturing method includes forming a plurality of concave patterns on an insulation layer, forming a stamper by filling copper in the concave patterns, separating the stamper from the insulation layer, providing roughness on the surface of the stamper, can separate the stamper from the insulation layer, can prevent the deformation of the stamper and can manufacture pluralities of stampers repeatedly.

6 Claims, 8 Drawing Sheets

MANUFACTURING METHOD FOR IMPRINTING STAMPER

CROSS-REFERENCE TO RELATED APPLICATIONS

This application claims the benefit of Korean Patent Application No. 10-2006-0099449 filed with the Korean Intellectual Property Office on Oct. 12, 2006, the disclosure of which is incorporated herein by reference in its entirety.

BACKGROUND

1. Technical Field

The present invention relates to manufacturing method for imprinting stamper.

2. Description of the Related Art

Among the fabricating method of the printed circuit board, the imprinting method uses a stamper having convex pattern protruded on the surface of it corresponding to the circuit pattern. The stamper is imprinted on to the insulation board, so that concave pattern is formed corresponding to the circuit pattern. And by filling conductive material in the concave pattern, a board having circuit pattern is formed.

The conventional imprinting stamper is manufactured from nickel stamper formed by nickel plating on the silicon master having a plural grooves, the nickel stamper is separated from the silicon master. And DLC (Diamond Like Carbon) coating, C4F8 coating or SAM (Self-Assembled Monolayer) coating is conducted on the silicon master for easy separation from the silicon master.

As described above, the conventional stamper takes coating process for easy separation from the silicon master. Therefore, the manufacturing process takes much time and the manufacturing cost is increased. In addition, the separation between the stamper and the silicon master is not smooth, so that faulty of the stamper is occurred. And the separation is conducted repeatedly, the faulty is occurred more frequently.

SUMMARY

An aspect of the invention aims to provide a manufacturing method having a simple manufacturing process.

Another aspect of the invention aims to provide a manufacturing method having decreased faulty.

The other aspect of the invention aims to provide a manufacturing method which can produce stampers repeatedly using an insulation layer.

One aspect of the invention provides a manufacturing method for the imprinting stamper which includes, forming a plurality of concave patterns on an insulation layer, forming a stamper by filling copper in the concave patterns, separating the stamper from the insulation layer, providing roughness on the surface of the stamper.

The information inputting device according to certain embodiments of the invention may have one or more of the following features. For example, wherein the concave pattern can comprise first concave part and a second concave part which is in communication with the first concave part and having a smaller diameter than the first concave part.

And the first concave part and the second concave part can be penetrated through the insulation layer. A base plate can be layered on the bottom surface of the insulation layer.

The stamper can have a protrusion part corresponding to the concave pattern and a body part formed integrally with the protrusion part. And the copper can be filled by the copper plating or electric plating in the concave pattern. The roughness can be formed by a black oxide process on the surface of the stamper.

Additional aspects and advantages of the present invention will be set forth in part in the description which follows, and in part will be obvious from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

The manufacturing method for imprinting stamper according to certain embodiments of the invention will be described below in more detail with reference to the accompanying drawings, in which those components are rendered the same reference number that are the same or are in correspondence, regardless of the figure number, and redundant explanations are omitted.

Figure 1:
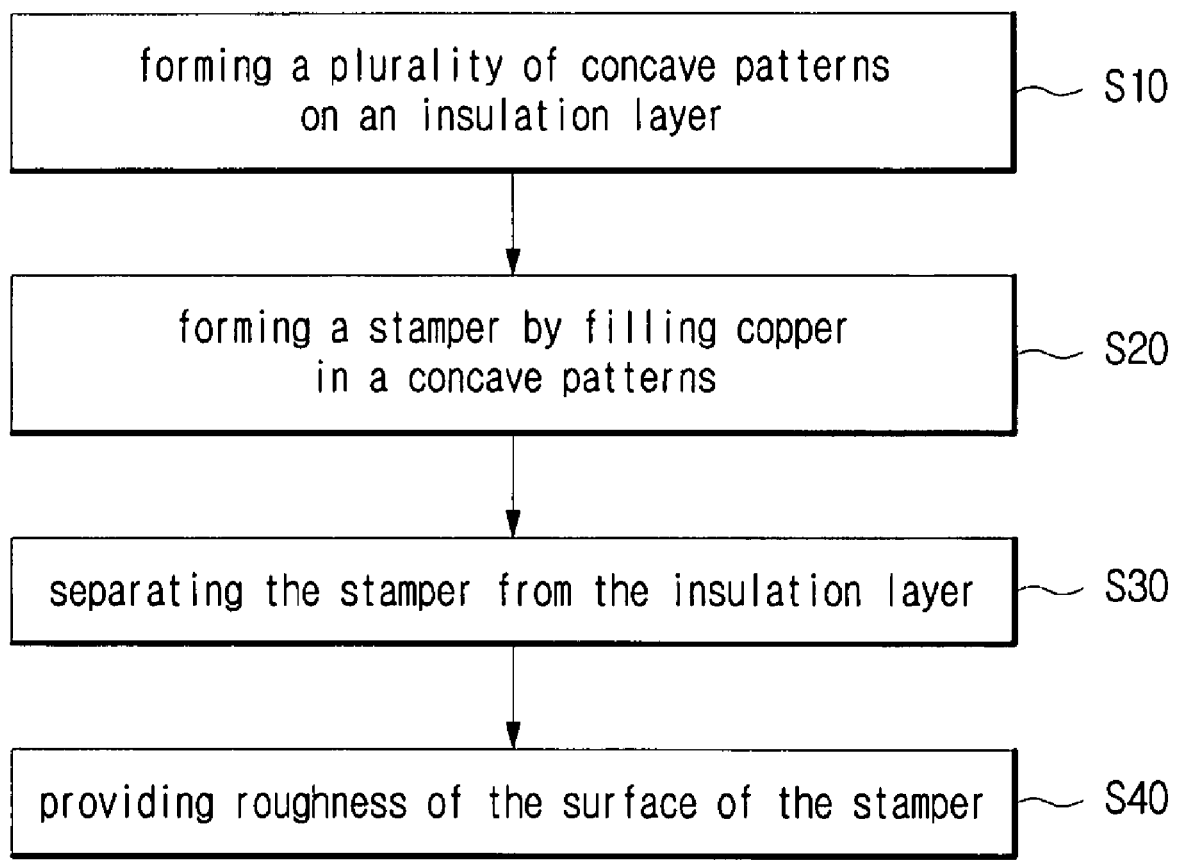
FIG. 1 is a flow chart presenting a manufacturing method for imprinting stamper according to an embodiment of the present invention.

FIG. 1 is a flow chart presenting a manufacturing method for imprinting stamper according to the one embodiment of the present invention.

Referring to the FIG. 1, one embodiment of the manufacturing method for imprinting stamper of the present invention comprise forming a plurality of concave patterns on an insulation layer (s10), forming a stamper by filling copper in the concave patterns (s20), separating the stamper from the insulation layer (s30), forming roughness on the surface of the stamper (s40).

The present invention features not to need an extra separation process to separate the stamper from the insulation layer as a master, because the copper filled in the concave pattern formed in the insulation layer is separated easily from the insulation layer. Accordingly, the present invention can save time and cost, can prevent the deformation of the stamper when separation and can use the insulation layer as a master repeatedly, because not to need extra coating for separation between the stamper and the insulation layer as a master.

The manufacturing method for imprinting stamper according to an embodiment of the present invention will be described as following referring from FIG. 2 to FIG. 7.

Figure 2:
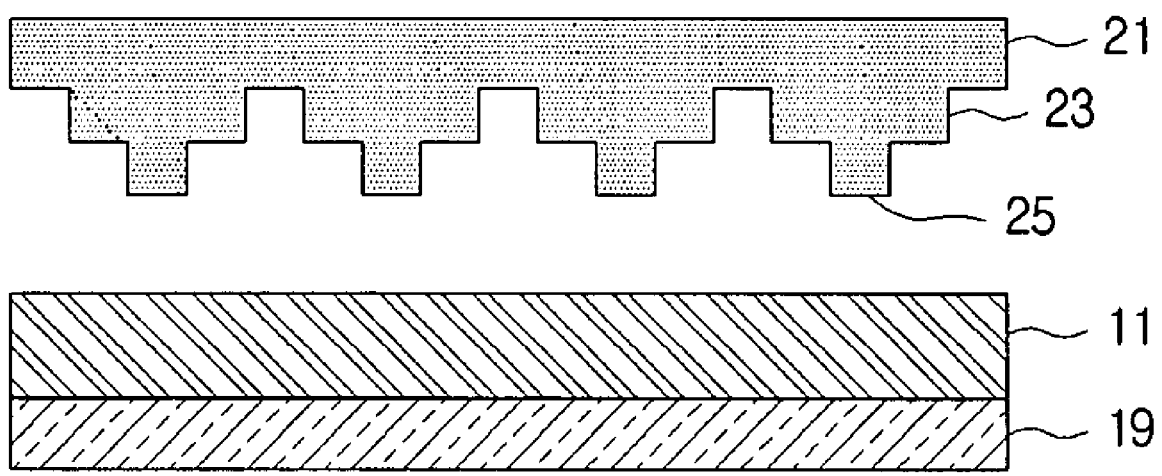
FIG. 2 is a cross-sectional view of an insulation layer and a conventional stamper in the manufacturing method for imprinting method according to an embodiment of the present invention.

FIG. 2 is a cross-sectional view of an insulation layer 11 and a conventional stamper 21 in the manufacturing method for imprinting method according to one embodiment of the present invention.

Referring to FIG. 2, the conventional stamper 21 and insulation layer 11 are provided to imprinting stamper. A general nickel stamper can be used as the stamper 21. And a plurality of first protrusions 23 and a second protrusions 25 on one surface of the stamper 21. The second protrusions 25 has smaller diameter than the first protrusion 23. Though the stamper 21 presented in FIG. 2 has the first protrusion 23 and the second protrusion 25, can have only the first protrusion 23 or a protrusion having the first protrusion 23 and the second protrusion 25.

The insulation layer 11 is formed by a conventional prepreg. The conventional prepreg is formed by penetrating thermosetting plastic (e.g. epoxy resin or BT resin) into glass fiber. And a base plate 19 is layered on the bottom surface of the insulation layer 11. The base plate 11 is contacted with the second protrusion 25 and determines the depth of indenting of the stamper 21 when the insulation layer is imprinted by the stamper 21. Copper clad Laminate can be used as the base plate 19. The copper clad laminate has an insulating resin and thin copper layers laminated both of the insulating resin.

Figure 3:
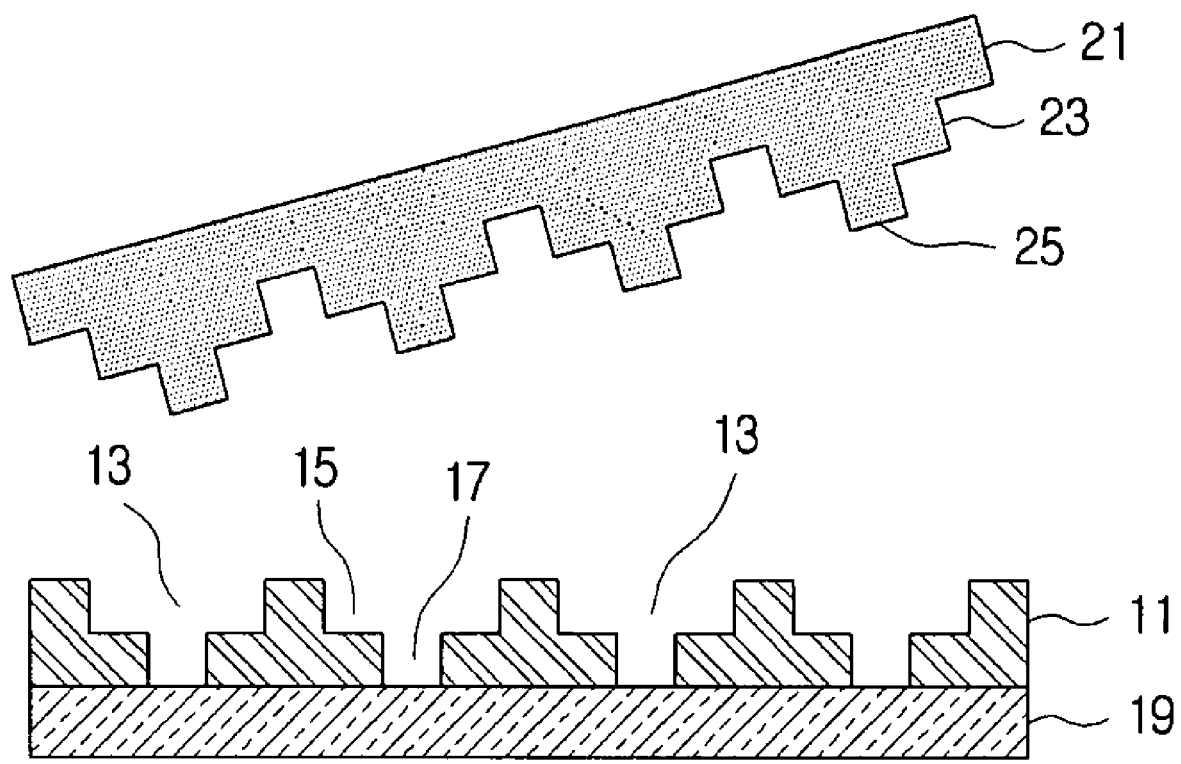
FIG. 3 is a cross-sectional view of forming a plural of concave pattern on the insulation layer.

FIG. 3 is a cross-sectional view of forming a plural of concave pattern 13 on the insulation layer 11.

First of all, the stamper 21 and the insulation layer 11 is aligned each other. A SUS plate (not illustrated) and a Kraft paper (not illustrated) are positioned on the bottom surface of the base plate 19 and Teflon film (not illustrated) and SUS plate and Kraft paper are positioned on the top surface of the stamper 21, and then imprinting process is conducted by heating and pressing. The temperature and pressure in the imprinting process can be varied according to the kind and the degree of hardening of the insulation layer 11. The Teflon film prevents the contamination of the insulation layer 11 and the Kraft paper prevents generation of a void and can help apply a uniform pressure.

As a result of the imprinting process, as illustrated in FIG. 3, pluralities of concave patterns 13 are formed on the insulation layer 11. The concave patterns 13 comprise a first concave part 15 corresponding to the first protrusion part 23 and a second concave part 17 corresponding to the second protrusion part 25. And the first concave part 15 is in communication with the second concave part 17. Of course, as described above, the shape of the concave pattern 13 is determined by the shape of the stamper 21.

Figure 4:
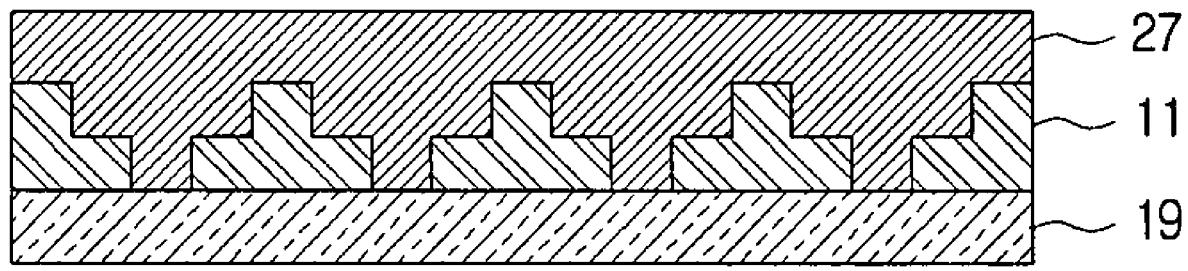
FIG. 4 is a cross-sectional view of completing the shape of the stamper by filling copper in the concave pattern.
Figure 5:
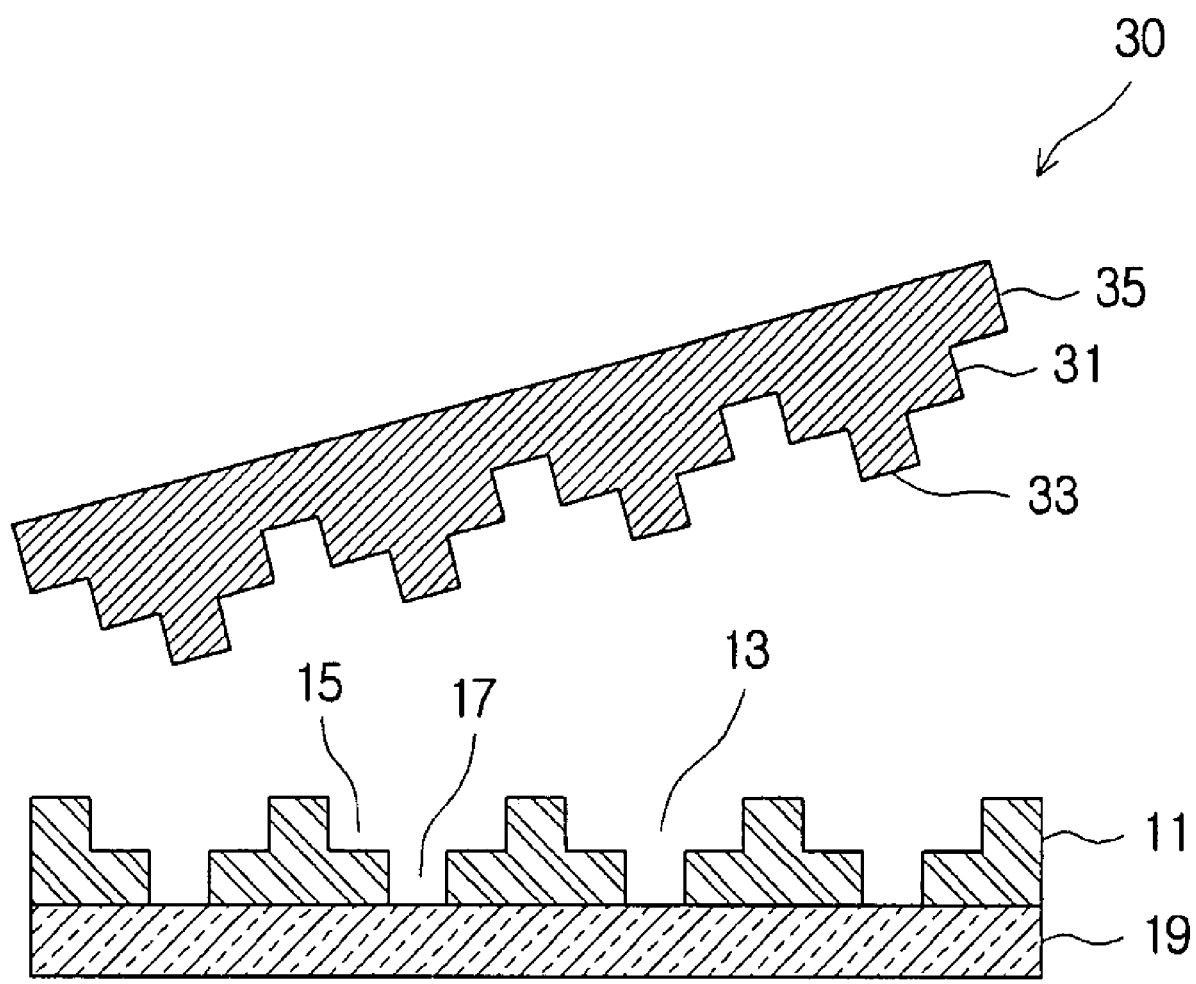
FIG. 5 is a cross-sectional view of separating the stamper from the insulating layer in FIG. 4.

FIG. 4 is a cross-sectional view of completing the shape of the stamper by filling copper 27 in the concave pattern 13, FIG. 5 is a cross-sectional view of separating the stamper from the insulating layer 11 in FIG. 4.

After forming the concave pattern 13 and hardening the insulation layer 11, the copper 27 is filled in the concave pattern 13. The copper 27 fills the concave pattern 13 and form a predetermined depth, which becomes the body of the stamper (referring to 35 in FIG. 5). The filling method of the copper can be copper plating or electric plating.

The copper 27 filled in the concave pattern 13 formed in the insulation layer 11 is separated easily from the insulation layer 11. This is because the copper 27 is filled directly instead of surface treatment process such as desmear process on the inner surface of the concave pattern 13. Therefore, as illustrated in FIG. 5, the stamper 30 can easily be separated from the insulation layer 11. And because the stamper 30 is separated from the insulation layer 11, the deformation of the stamper 30 can be prevented.

The stamper 30 has a body part 35, a first protrusion part 31 and a second protrusion 33 which are projected from one surface of the body part 35. The first protrusion 31 is corresponded to the first concave part 15 of the insulation layer 11 and the second protrusion 33 is corresponded to the second concave part 17 of the insulation layer 11. Of course, the stamper 30 can have only the first protrusion part 31 or more than three-stage protrusion on the basis of the specification of desired boards. The first protrusion part 31 is imprinted to form a groove in which circuit pattern can be formed, the second protrusion 33 can form via hole which connects the circuit pattern each other.

Figure 6:
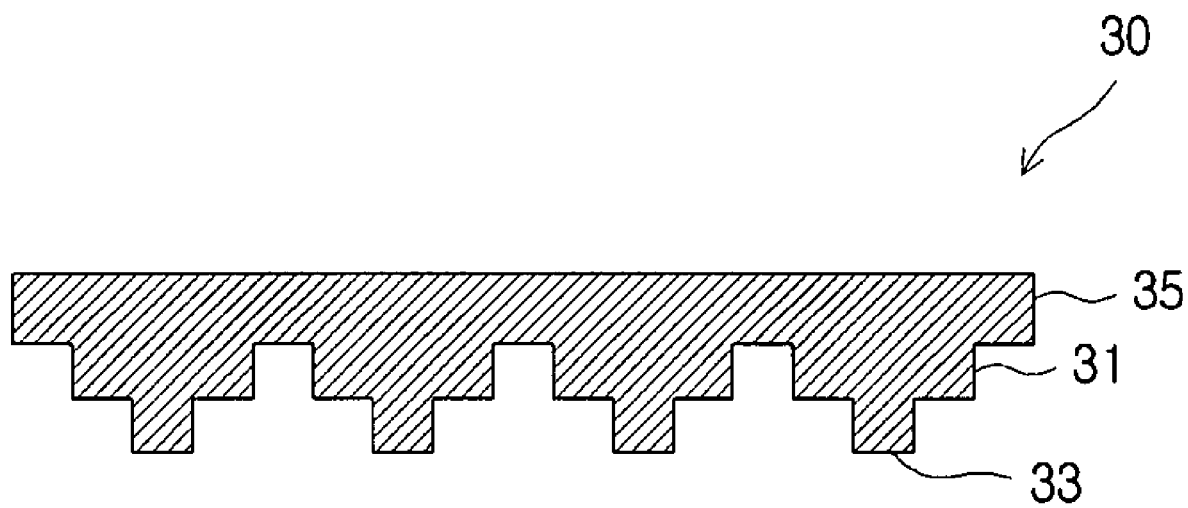
FIG. 6 is a cross-sectional view of separated stamper in FIG. 5.
Figure 7A:
FIG. 7A and FIG. 7B are cross-sectional views explaining a black oxide process providing roughness on the stamper.
Figure 7B:
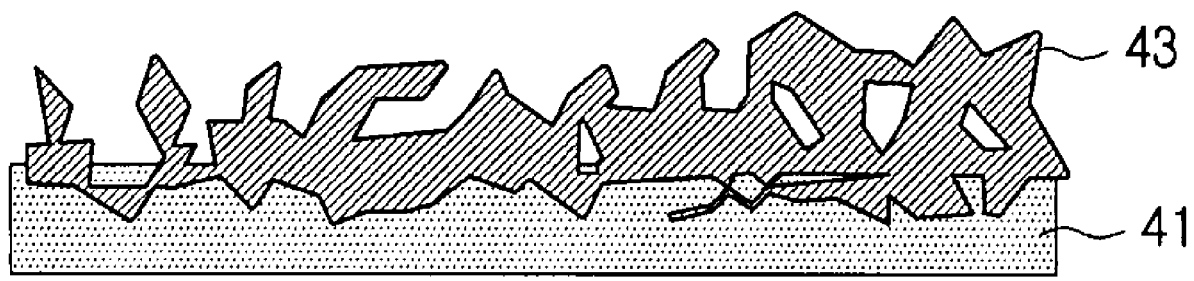

FIG. 6 is a cross-sectional view of separated stamper 30 in FIG. 5.

Roughness is given to the surface of the stamper 30 separated from the insulation layer 11, so that the force of adhesion between the insulation and the stamper is increased. The method of applying roughness to the surface of the stamper are black oxide process, soft etching process, chemical surface treatment such as chemical washing or acid treatment process, mechanical surface treatment such as brush method, abrasive grain method or jet scrub method and combination thereof.

The oxide process is a surface treatment method to strengthen the roughness by oxidizing the surface of the stamper 30. If the black oxide is conducted on the copper layer 41 having smooth surface of FIG. 7A, the roughness 43 on the surface of the copper layer 41 is generated. The roughness 43 increases the area contacted to the insulation layer 11, so that coherence between the stamper 30 and the insulation layer 11 is increased.

The soft etching method generates roughness on a surface by using soft etching solution comprising heavy water ($H_2O_2$) and sulphuric acid ($H_2SO_4$) and has advantage of excellent washing. And soft etching solution comprising $Na_2S_3O_8$ and $H_2O_2$ can provide uniform surface treatment.

Chemical washing method is surface treatment process conducting acid cleaner and soft etching in sequence. And acid treatment method is surface treatment using 5~10% sulphuric.

The mechanical surface treatment method conducts surface treatment by grinding brush without a chemical treatment. The brush method washes the surface of the stamper 30 using various type of brush and provides roughness. The abrasive grain method sprays abrasive grains on the surface of the stamper and grinding by a nylon brush. And the jet scrub method spays abrasive grains such as aluminum oxide ($Al_2O_3$) with high pressure to treat a surface without using brush.

The brush and the soft etching method can increase the uniformity of roughness and soften the roughness by scrubbing with a brush and adding a chemical treatment. And the soft etching and brush method first generates roughness on the copper layer and removes the chemical contamination with a brush. And acid treatment and brush method, which is conducted most frequently, removes an oxide, finger printing and distillate by acid treatment and provides roughness on the surface with a brush.

Roughness is provided on the surface of the stamper 30 by a roughness generating process according to the chemical, mechanical method and combination thereof. And the stamper 30 can be manufactured repeatedly by filling copper in the insulation layer 11 from which the stamper 30 is separated smoothly. Accordingly, the time and cost due to manufacturing extra master 11 can be decreased. In addition, if imprinting is conducted on the insulation layer 11 by using the conventional stamper 21 illustrated in the FIG. 1, copper stampers 30 having a various size can be manufactured.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing an imprinting stamper, comprising:
   forming a plurality of concave patterns on an insulation layer;
   forming the stamper by filling copper in the concave patterns, the stamper including a protrusion part corresponding to the concave patterns and a body part formed integrally with the protrusion part, the body Part being stacked on the insulation layer;
   separating the stamper from the insulation layer; and
   providing roughness on a surface of the stamper.

2. The method of claim 1, wherein the concave patterns include a first concave part and a second concave part, the second concave part being in communication with the first concave part and having a smaller diameter than the first concave part.

3. The method of claim 2, wherein the first concave part and the second concave part are penetrated through the insulation layer.

4. The method of claim 3, further comprising a base plate layered on a bottom surface of the insulation layer.

5. The method of claim 1, wherein the copper is filled by a plating process which does not include a desmear process.

6. The method of claim 1, wherein providing the roughness includes performing a black oxide process on the surface of the stamper.

* * * * *

UNITED STATES PATENT AND TRADEMARK OFFICE
CERTIFICATE OF CORRECTION

PATENT NO. : 7,644,496 B2 Page 1 of 1
APPLICATION NO. : 11/907288
DATED : January 12, 2010
INVENTOR(S) : Jeong-Bok Kwak et al.

It is certified that error appears in the above-identified patent and that said Letters Patent is hereby corrected as shown below:

Column 5, Line 11, claim 1, change "Part" to --part--.

Signed and Sealed this

Sixth Day of April, 2010

David J. Kappos
*Director of the United States Patent and Trademark Office*